(12) United States Patent
Greene et al.

(10) Patent No.: US 7,977,185 B2
(45) Date of Patent: Jul. 12, 2011

(54) METHOD AND APPARATUS FOR POST SILICIDE SPACER REMOVAL

(75) Inventors: Brian J. Greene, Danbury, CT (US);
Chung Woh Lai, Singapore (SG); Yong Meng Lee, Singapore (SG); Wenhe Lin, Singapore (SG); Siddhartha Panda, Beacon, NY (US); Kern Rim, Yorktown Heights, NY (US); Young Way Teh, Singapore (SG)

(73) Assignees: International Business Machines Corporation, Armonk, NY (US); Chartered Semiconductor Manufacturing Ltd., Singapore (SG)

( * ) Notice: Subject to any disclaimer, the term of this patent is extended or adjusted under 35 U.S.C. 154(b) by 147 days.

(21) Appl. No.: 11/164,417

(22) Filed: Nov. 22, 2005

(65) Prior Publication Data
US 2007/0161244 A1    Jul. 12, 2007

(51) Int. Cl.
*H01L 21/33* (2006.01)
(52) U.S. Cl. ... 438/257; 438/149; 438/197; 257/E21.01; 257/E21.218; 257/E21.248
(58) Field of Classification Search .............. 438/231, 438/689, 303, 305, 307, 644, 655, 660, 592; 257/383, 384, 413, 377, 391
See application file for complete search history.

(56) References Cited

U.S. PATENT DOCUMENTS

| | | | | |
|---|---|---|---|---|
| 5,089,986 | A * | 2/1992 | Sandhu et al. | 365/149 |
| 6,121,100 | A * | 9/2000 | Andideh et al. | 438/305 |
| 6,150,266 | A * | 11/2000 | Lin et al. | 438/682 |
| 6,211,083 | B1 * | 4/2001 | Yang et al. | 438/682 |
| 6,215,190 | B1 * | 4/2001 | Bruce et al. | 257/774 |
| 6,573,172 | B1 * | 6/2003 | En et al. | 438/626 |
| 6,660,605 | B1 * | 12/2003 | Liu | 438/307 |
| 6,767,777 | B2 * | 7/2004 | Joyner et al. | 438/184 |
| 6,777,299 | B1 * | 8/2004 | Chiu et al. | 438/303 |
| 6,933,577 | B2 * | 8/2005 | Cabral et al. | 257/384 |
| 7,053,400 | B2 * | 5/2006 | Sun et al. | 257/19 |
| 7,179,745 | B1 * | 2/2007 | Waite et al. | 438/694 |
| 7,214,988 | B2 * | 5/2007 | Tsao et al. | 257/368 |
| 7,393,746 | B2 * | 7/2008 | Dyer et al. | 438/257 |
| 7,445,978 | B2 * | 11/2008 | Teh et al. | 438/199 |
| 2002/0106875 | A1 * | 8/2002 | Joyner et al. | 438/581 |
| 2004/0080003 | A1 * | 4/2004 | Lee | 257/413 |
| 2004/0087155 | A1 * | 5/2004 | Wieczorek et al. | 438/689 |
| 2005/0087824 | A1 * | 4/2005 | Cabral et al. | 257/412 |
| 2005/0224867 | A1 * | 10/2005 | Huang et al. | 257/327 |
| 2005/0247926 | A1 | 11/2005 | Sun et al. | |
| 2007/0072358 | A1 * | 3/2007 | Wu et al. | 438/233 |

* cited by examiner

*Primary Examiner* — Mary Wilczewski
*Assistant Examiner* — Telly D Green
(74) *Attorney, Agent, or Firm* — McGinn Intellectual Property Law Group, PLLC

(57) ABSTRACT

A method (and apparatus) of post silicide spacer removal includes preventing damage to the silicide spacer through the use of at least one of an oxide layer and a nitride layer.

14 Claims, 5 Drawing Sheets

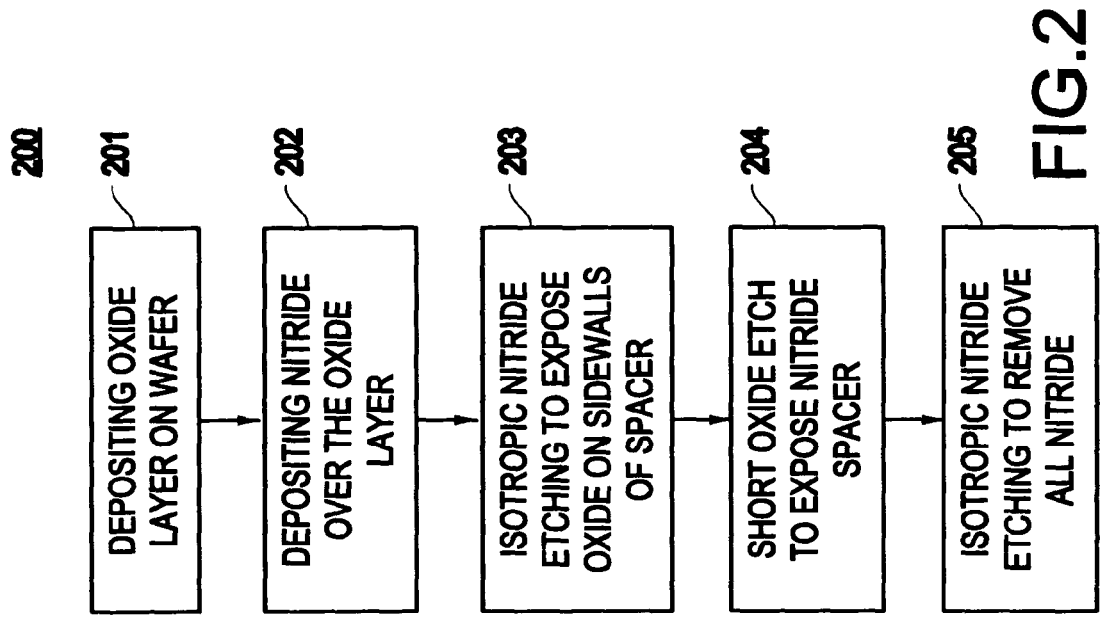
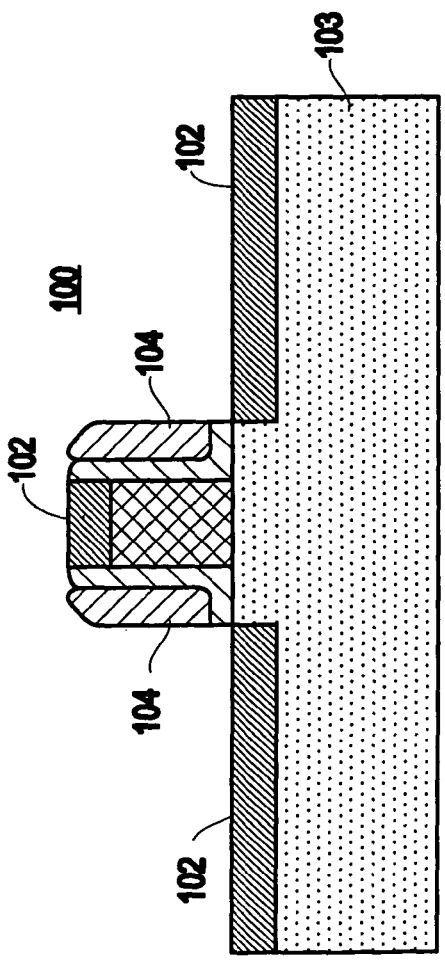
FIG.1A
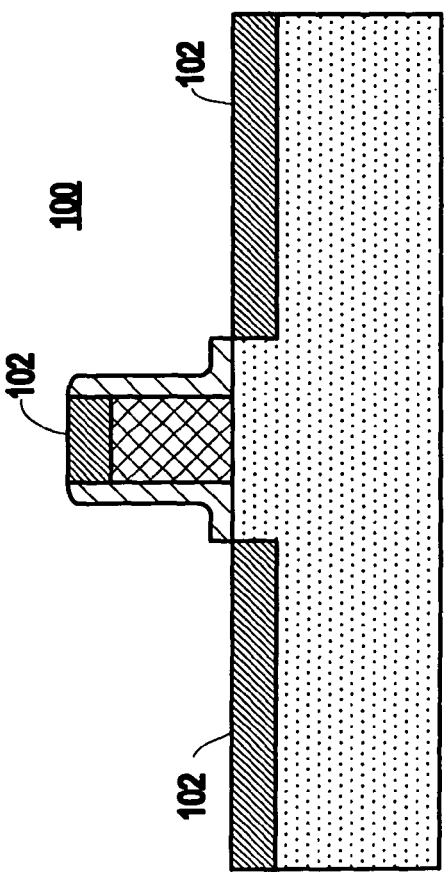
FIG.1B

METHOD AND APPARATUS FOR POST SILICIDE SPACER REMOVAL

BACKGROUND OF THE INVENTION

1. Field of the Invention

The present invention generally relates to a method for post silicide spacer removal, and more particularly to a method for removing a nitride spacer while protecting the suicide layer from damage.

2. Description of the Related Art

It is known that appropriately applied stress in a device channel can be beneficial to the performance of the device. The applied stress may be obtained through, among other means, the use of a stressed nitride liner as a contact etch stop layer. It is also known that the stress from the nitride liner is more efficiently transferred to a device channel when it is brought in close proximity to the device channel. One means of accomplishing this is to remove the sidewall spacers typically employed in the art prior to stressed nitride liner deposition. The sidewall spacers are commonly employed for a number of purposes, such as offsetting the heavily doped source and drain regions of the metal-oxide-silicon field effect transistor (MOSFET) from the channel region and to block silicidation between the source and drain regions of the MOSFET and the gate electrode.

Additionally, the thickness of the stressed liner that can be employed is often limited by the aspect ratio of the spaces to be filled with the stressed liner. This limitation can be mitigated somewhat by removing the sidewall spacers from the gate electrode, reducing the aspect ratios of the most densely placed gate electrodes, reducing the aspect ratios of the most densely placed gate structures, thus enabling the use of thicker stressed liners.

Thinning or removing the spacer is quite difficult, however, due to the proclivity of a majority of conventional etches to attack silicide along with the oxide and/or nitride spacer.

Conventionally, there exist several known methods for removing sidewall spacers. One such method involves removal of the spacer prior to silicidation of the device. A problem with this process is that, upon silicidation of the device, it is difficult to control the lateral position of the silicide in relation to the gate. Thus, this first method of spacer removal requires one to use a thin liner material, such as oxide, positioned immediately beneath the spacer to be removed to block silicidation between the source and drain regions of the device and the gate electrode.

Typical surface preparation methods for optimal silicide formation include oxide and nitride etches, which attack the thin liner material, particularly at the edges, where two-dimensional etching effects are present. As a result, the controllability of such a process is poor, and product yield loss is a likely result.

A second method of spacer removal involves removal of the spacer after silicide formation is complete. A "brute-force" approach is impractical, however, requiring the use of an etch chemistry which can effectively remove the nitride spacer but is selective to oxide, heavily doped silicon, and silicide. This puts many constraints on the type of etching that may be used to remove the spacer. In addition, because the silicide is exposed to the etch, the suicide resistance may be degraded, resulting in an undesirable increase in extrinsic resistance on the MOSFET.

Presently there are no conventional post silicide spacer removal methods that allow the nitride spacer to be removed while protecting the silicide from attack.

SUMMARY OF THE INVENTION

In view of the foregoing and other exemplary problems, drawbacks, and disadvantages of the conventional methods and structures, an exemplary feature of the present invention is to provide a method (and apparatus) in which a nitride spacer may be removed after silicidation while protecting the silicide from attack.

According to a first exemplary aspect of the present invention, a method of post silicide spacer removal includes preventing damage to the silicide through the use of at least one of an oxide layer and a nitride layer.

According to a second exemplary aspect of the present invention, a method of post silicide spacer removal includes depositing an oxide layer over the spacer and the silicide, and depositing a nitride layer over the oxide layer.

The present invention provides a method (and system) for post silicide spacer removal where the nitride spacer may be removed while protecting the silicide from attack. Because of this feature, the spacer may be removed without affecting the extrinsic series resistance of the device.

Therefore, by employing the method of the present invention, one can improve the stress transfer efficiency of a given contact etch stop liner process. Additionally, a thicker stressed nitride liner may be used because the aspect ratio of nested structures is reduced, further increasing the amount of stress imparted to the device channel.

Therefore, with the above and other unique and unobvious exemplary aspects of the present invention, it is possible to increase device performance beyond what is possible with a traditional stressed nitride liner process.

BRIEF DESCRIPTION OF THE DRAWINGS

The foregoing and other exemplary purposes, aspects and advantages will be better understood from the following detailed description of an exemplary embodiment of the invention with reference to the drawings, in which:

FIG. 1A illustrates a partially processed MOSFET 100 after a silicidation and prior to removal of the nitride spacer according to an exemplary embodiment of the present invention;

FIG. 1B illustrates a partially processed MOSFET 100 after the nitride spacer has been removed using a method of post silicide spacer removal according to an exemplary embodiment of the present invention;

FIG. 2 depicts a flow diagram of a method 200 of post silicide spacer removal according to an exemplary embodiment of the present invention;

DETAILED DESCRIPTION OF EXEMPLARY EMBODIMENTS OF THE INVENTION

Figure 3A:
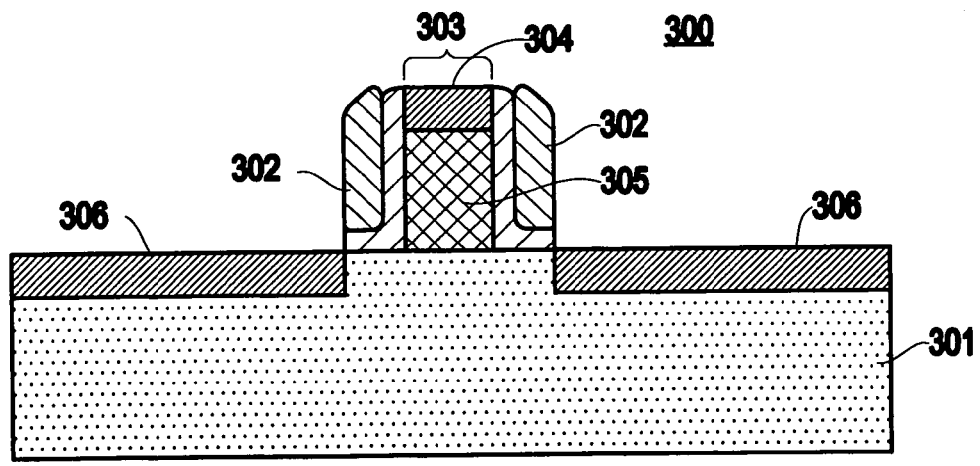
FIG. 3A illustrates processing of a MOSFET 300 (similar to the MOSFET 100 depicted in FIG. 1) in the method 200 of post silicide spacer removal according to an exemplary embodiment of the present invention.
Figure 3B:
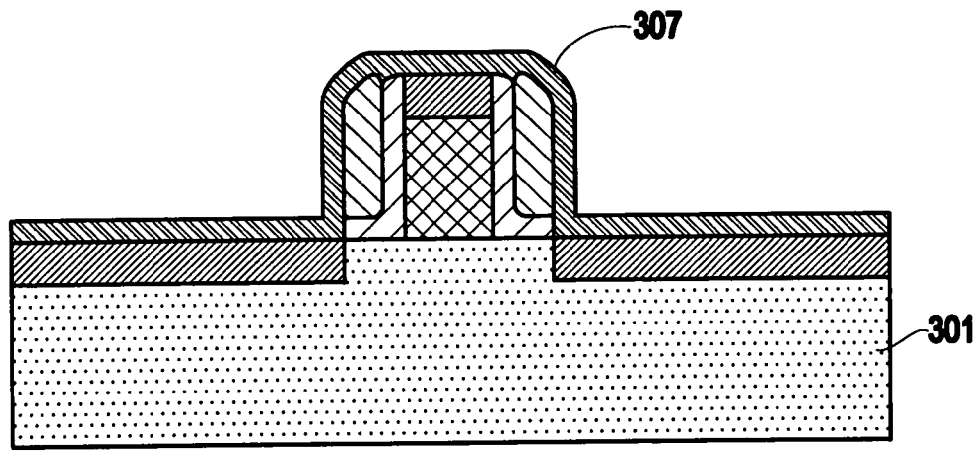
FIG. 3B illustrates deposition of an oxide layer 307 in the method 200 of post silicide spacer removal according to an exemplary embodiment of the present invention.
Figure 3C:
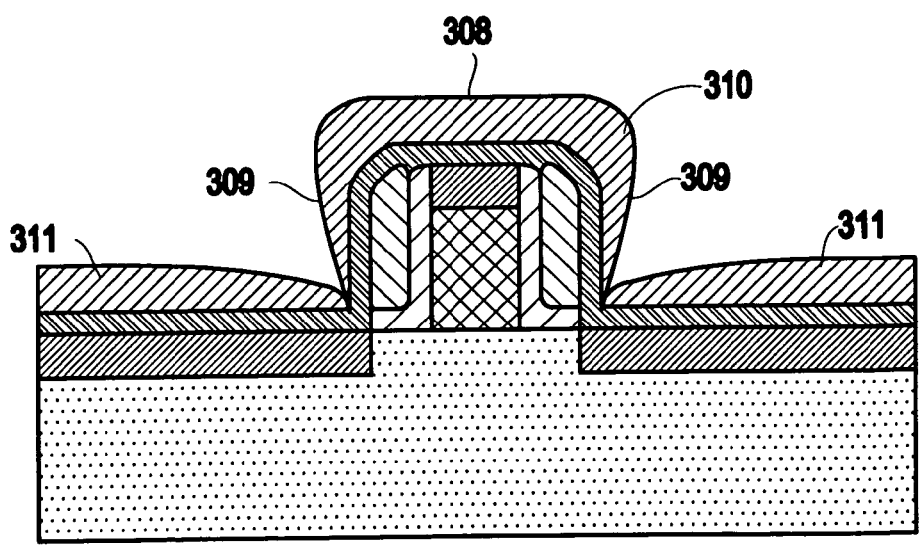
FIG. 3C illustrates deposition of a nitride layer 308 in the method 200 of post silicide spacer removal according to an exemplary embodiment of the present invention.

Referring now to the drawings, and more particularly to FIGS. 1A-4, there are shown exemplary embodiments of the method and structures according to the present invention.

FIG. 1A depicts a modern MOSFET structure 100. The MOSFET 100 depicted in FIG. 1A has been processed up to the point of contact etch stop liner deposition. The suicide layer 102 has been deposited over the substrate 101. Preferably, the silicide layer 102 has a thickness in a range of 5 nm to 20 nm. At this point, however, the spacer (e.g., the nitride spacer) 104 is still intact. Exemplary aspects of the claimed invention are directed to removing the nitride spacer 104 without attacking the silicide layer 102.

FIG. 1B depicts the wafer 100 after the nitride spacer 104 is removed using the method according to the present invention. FIG. 1B clearly shows that while the nitride spacer 104 has been completely removed, the silicide layer 102 has remained unaffected by the post silicide removal process of the present invention.

FIG. 2 depicts a flow diagram illustrating a method 200 of post silicide spacer removal according to an exemplary embodiment of the present invention. The method 200 includes depositing an oxide layer over the processed wafer (step 201). Next, a nitride layer is deposited over the oxide layer (step 202). Then, an isotropic nitride etching is conducted to expose the oxide layer on the sidewalls of the spacer (step 203). Once the oxide is exposed, the exposed oxide is removed using a short oxide etch to expose the nitride spacer (step 204). The nitride layers on the wafer, including the deposited nitride masking layer and the nitride spacer, are removed using an isotropic nitride etch (step 205). The oxide which was deposited in step 201 protects the silicide and the underlying silicon substrate from exposure to the nitride removal etch altogether.

FIGS. 3A-3H further illustrate the post silicide spacer removal method 200 of the present invention, by depicting a processed MOSFET 300 during each step of the spacer removal method 200.

FIG. 3A depicts a MOSFET 300 processed up to the point of contact etch stop liner deposition. The structure includes a substrate 301, which is typically made of silicon. However, the substrate 301 is not limited to a silicon substrate and any suitable substrate material may be used in place of silicon. A gate 305 is formed on a surface of the substrate 301. The gate 305 may include any suitable gate material including, but not limited to, metal, polysilicon, silicide, or multilayers thereof. An oxide liner etch stop 303 is formed on each side of the gate 305. A nitride spacer 302 is formed adjacent each of the oxide liner etch stops 303 so that the oxide liner etch stop 303 is disposed between the nitride spacer 302 and the gate 305.

The wafer 300 includes a silicide layer 306 deposited over the surface of the substrate 301 on which the gate 305 is formed, as well as a silicide layer 304 formed over the gate. The silicide layer will typically include primarily Ni, Co, Pt, Ti, or W and may include alloys of the same. However, any suitable silicide may be used.

A thin, low-temperature oxide layer 307 (see FIG. 3B) is then deposited on the wafer 300. It is preferable that the oxide layer 307 is uniformly deposited on the wafer 300. Additionally, the oxide layer 307 is deposited on the wafer by a conformal deposition. The oxide layer 307 will prevent the substrate from exposure to the nitride spacer removal etch. The oxide layer 307 may include any oxide and is not limited to any particular oxide material. However, preferable oxide materials include low temperature CVD oxides, plasma enhanced CVD oxides, chemical oxides, and TEOS.

The thin oxide layer preferably has a thickness in a range from approximately 20 Å to 500 Å, more preferably in a range of 50 Å to 100 Å.

For purposes of the claimed invention, a low-temperature oxide (LTO) refers to an oxide layer deposited at approximately 480° or below. If the oxide is deposited at a higher temperature than 480°, then the nitride-silicide will agglomerate or demonstrate other erratic behavior, such as encroachment into the source and drain extensions, potentially degrading off state leakage of the device. If a cobalt-silicide is used, however, then the oxide layer may be deposited at a temperature of approximately 500° or below.

A nitride layer 308 is then deposited over the oxide layer 307, preferably within a range of 50 Å to 100 Å. Preferably, the nitride layer 308 is an anisotropic nitride (see FIG. 3C), such that the deposited nitride is substantially thicker on horizontal surfaces than on vertical surfaces. As opposed to the oxide layer 307, which is conformly deposited over the wafer, the nitride layer 308 is intentionally deposited nonconformally over the oxide layer 307.

The nitride layer 308 is deposited to form a horizontal nitride layer region 311 and a horizontal nitride layer region 310 disposed over the silicide layers 306, 304, parallel to the surface of the substrate 301. The nitride layer 308 also includes vertical nitride layer regions 309 disposed over the sidewalls of the nitride spacer 302. The horizontal nitride layer regions 310, 311 have a thickness that is greater than the thickness of the vertical nitride layer regions. The thickness of the horizontal nitride layer regions 310, 311 is preferably in a range from 100 Å to 1000 Å, whereas the thickness of the vertical nitride layer regions 309 is preferably in a range from 0 Å to 500 Å.

The nitride layer 308 is preferably deposited using a plasma enhanced chemical vapor deposition (CVD) process. However, any other suitable deposition process may be used, such as rapid thermal CVD or low pressure CVD, as long as the resulting structure results in nonconformal deposition as described.

Figure 3D:
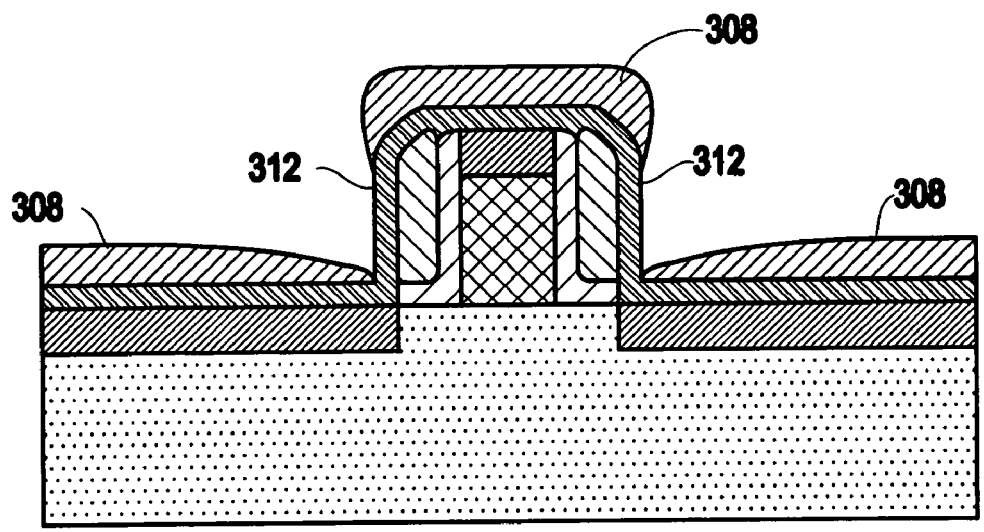
FIG. 3D illustrates etching of the nitride layer 308 in the method 200 of post silicide spacer removal according to an exemplary embodiment of the present invention.

The deposition of the nitride layer 308 is followed by an isotropic nitride etch, which is, for example, an isotropic plasma etch, which removes portions of the nitride layer 308 to expose only the oxide layer 307 disposed on the sidewalls 312 of the nitride spacer 302 (see FIG. 3D). The horizontal nitride layer regions 310, 311 of the nitride layer 308 are not removed by the isotropic nitride etch. The nitride removal etch process uses, for example, fluorocarbons, $CHF_3$ (10-40%), $CH_2F_2$ (10-40%), $CH_3F$ (10-40%), and oxygen (10-50%) in an inductively coupled reactor with a pressure range of 20-100 mT, a plasma power range of 0.05-0.3 W/cm$^2$ and a bias power of 0-40 V.

Preferably, only the portions of the nitride layer 308 disposed on the sidewalls 312 of the nitride spacer 302 are removed so that the silicide layers 304, 306 remain protected. This is achieved through the intentionally non-conformal deposition of the nitride layer 308.

That is, because the vertical nitride layer regions 309 have a thickness that is smaller than the thickness of the horizontal nitride layer regions 310, 311, the entire nitride layer 308 disposed on the sidewalls 312 of the nitride spacer 302 may be removed without exposing the oxide layer 307 disposed over the silicide layers 304, 306. That is, the nitride layer 308 disposed on the sidewalls 312 of the nitride spacer 302 will clear before the nitride layer 308 disposed over the silicide layers 304, 306.

A short oxide etch is then used to remove the oxide layer 307 disposed on the sidewalls of the nitride spacer 302 to expose the nitride spacer.

Figure 3E:
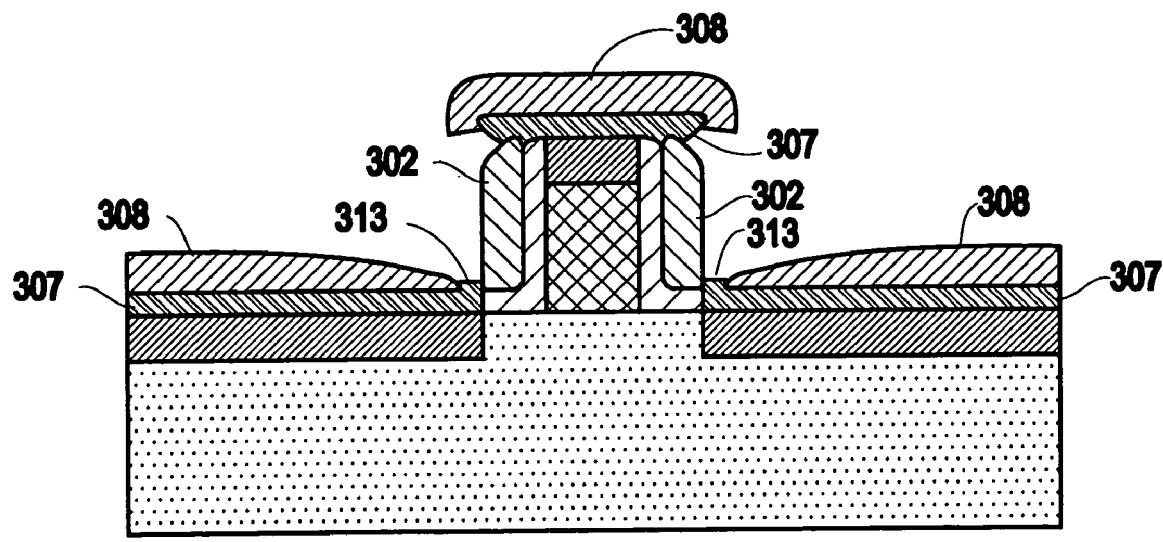
FIG. 3E illustrates etching of the oxide layer 307 in the method 200 of post suicide spacer removal according to an exemplary embodiment of the present invention.

As depicted in FIG. 3E, a corner portion 313 of the oxide layer 307 disposed on the corner of the spacer 302 adjacent to the substrate 301 is not removed during the short oxide etch. The corner portion 313 of the oxide layer 307 remains on the device 300 to reduce over-etching.

Thus, for purposes of the present invention, a "short" oxide etch refers to an etch that is conducted long enough to clear the oxide layer 307 disposed on the sidewalls of the nitride spacer without exposing the corner of the silicide layers 306. This leaves the silicide layers 306 protected from attack during the subsequent nitride etch.

Figure 3F:
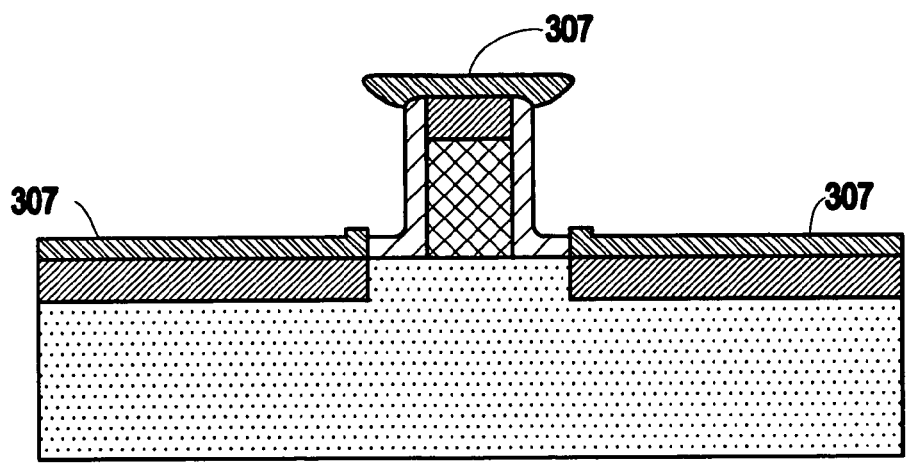
FIG. 3F illustrates etching the nitride from the wafer in the method 200 of post silicide spacer removal according to an exemplary embodiment of the present invention.

The remaining nitride, including the nitride spacer 302 and the nitride masking layer 308, is isotropically etched from the wafer 300 (see FIG. 3F). The nitride etch preferably uses a hot phosphoric acid dip. The hot phosphoric acid dip includes phosphoric acid and hydrogen peroxide at a temperature in a range of 100° C. and 200°, more preferably in a range of 130° C. and 160°. Alternatively, one could employ a dry etch process which is selective to the underlying oxide layer 307.

Figure 3G:
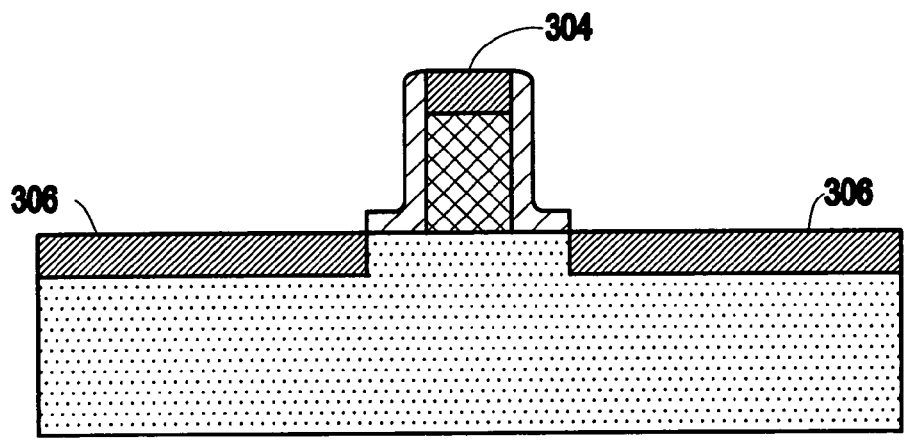
FIG. 3G illustrates reactive ion etching (RIE) of the spacer 302 in the method 200 of post silicide spacer removal according to an exemplary embodiment of the present invention.

Once the nitride spacer 302 is removed from the wafer 300, an optional short oxide reaction ion etch (RIE) may be used to remove the remaining oxide layer 307 (see FIG. 3G). As depicted in FIG. 3G, the entire nitride spacer 302 is removed without attacking the deposited silicide layers 304, 306.

Figure 3H:
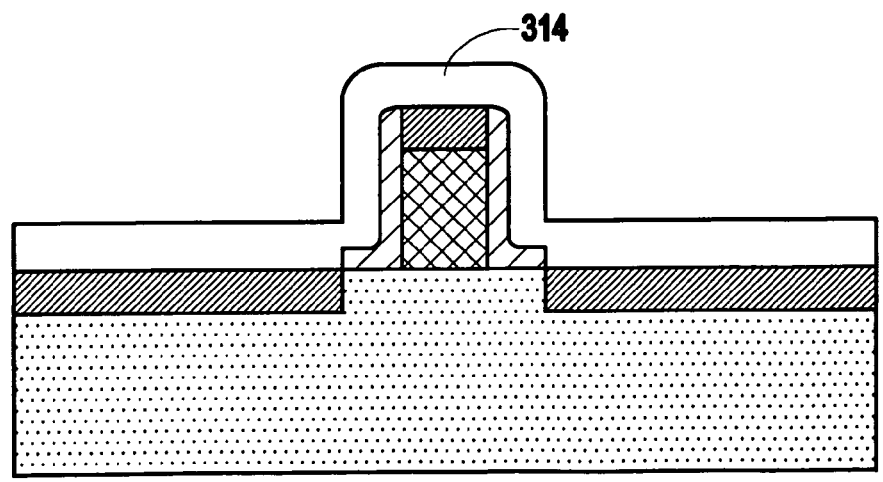
FIG. 3H illustrates depositing a stressed nitride layer 314 over the wafer 300 in the method 200 of post silicide spacer removal according to an exemplary embodiment of the present invention.

At this time, an appropriately stressed nitride layer 314 may be deposited over the wafer 300 (see FIG. 3H). In order to obtain enhanced device performance, typically tensile nitrides are employed for negative channel field effect transistors (NFETs), and compressive nitrides are employed for positive channel field effect transistors (PFETs). Alternatively, if the optional short oxide RIE is not conducted, the stressed nitride layer 314 may be deposited over the device depicted in FIG. 3F.

The stressed nitride layer 314 has a thickness in a range of 100 Å to 1500 Å, and more preferably a thickness in a range of 500 Å to 1000 Å. The stressed nitride layer 314 has improved stress transfer efficiency due to the thinner (or completely removed) spacer. For purposes of the present application, "stress transfer efficiency" is defined as the stress induced in the device channel for a given nitride 314 stress and thickness. In addition, because the total spacer width is reduced (or completely removed), the possibility of void formation during nitride fill of nested structures is reduced. Since the free space between dense gate structures is larger (as a result of removing the spacers), one can utilize thicker stressed nitride than might otherwise be allowed. By reducing the spacer thickness, and subsequently increasing the liner thickness by an equivalent amount, further enhancement to device performance may be obtained.

An additional advantage of the post silicide spacer removal method of the present invention is that the gate 304 is never exposed to the etching processes. Therefore, there is minimal negative impact on the device characteristics, because the degradation associated with silicide and/or silicon erosion during spacer removal etching is avoided entirely.

Figure 4:
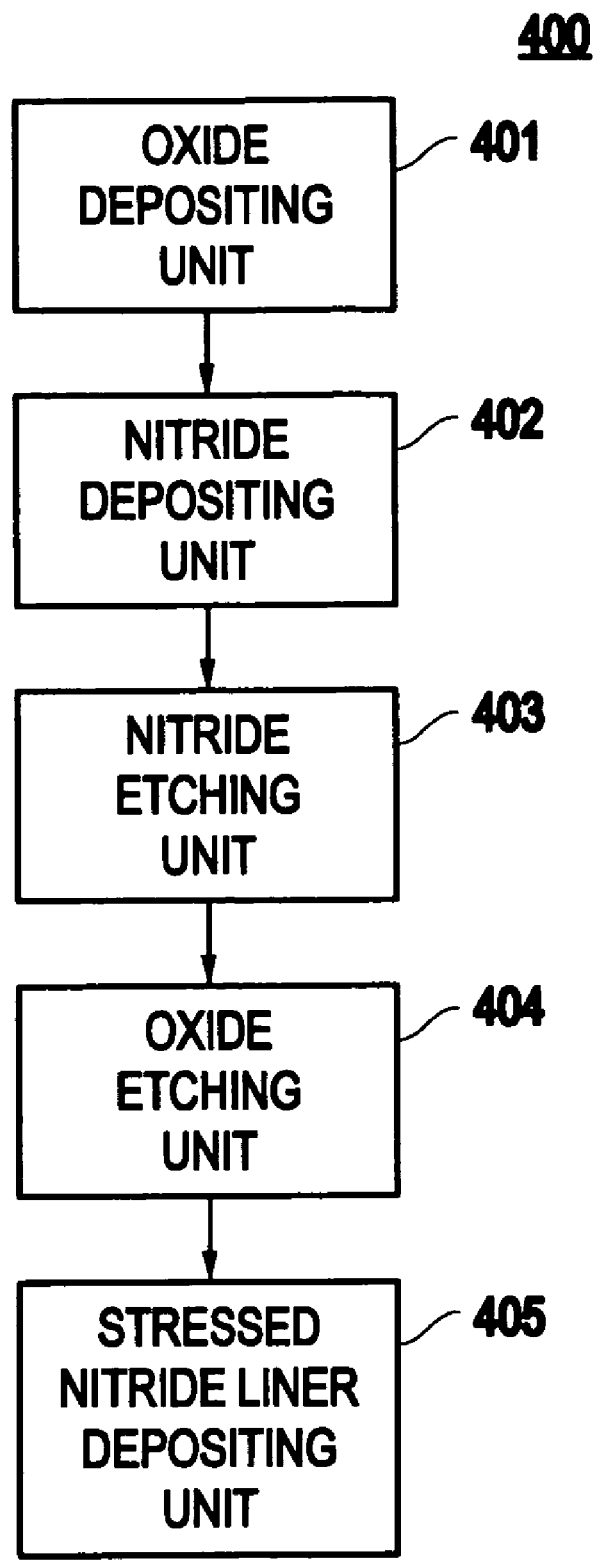
FIG. 4 depicts a block diagram illustrating a system 400 for post silicide spacer removal according to an exemplary embodiment of the present invention.

FIG. 4 illustrates an apparatus 400 for the post silicide removal of a nitride spacer according to an exemplary embodiment of the present invention. The apparatus 400 includes an oxide depositing unit 401, a nitride depositing unit 402, a nitride etching unit 403, an oxide etching unit 404 and a stressed nitride liner depositing unit 405.

The oxide depositing unit 401 deposits a thin, low temperature oxide layer uniformly over a processed wafer. The nitride depositing unit 402 then deposits an anisotropic layer over the previously deposited oxide layer.

The nitride etching unit 403 exposes the oxide on the sidewalls of the spacer only. The oxide etching unit 404 removes the oxide on the sidewalls of the spacer to expose the nitride spacer. The nitride etching unit 403 then removes all of the nitride, including the nitride masking layer and the nitride spacer from the wafer. The stressed liner depositing unit 405 deposits an appropriately stressed liner over the wafer.

The present invention provides a method (and system) for post silicide spacer removal where the nitride spacer may be removed while protecting the silicide from attack. Because of this feature, the spacer may be removed without affecting the extrinsic series resistance of the device.

Therefore, by employing the method of the present invention, one can improve the stress transfer efficiency of a given contact etch stop liner process, increasing device performance. Additionally, removal of the nitride spacer enables the use of thicker stressed liners, and consequently, further enhancement of device performance.

While the invention has been described in terms of several exemplary embodiments, those skilled in the art will recognize that the invention can be practiced with modification within the spirit and scope of the appended claims.

Further, it is noted that, Applicants' intent is to encompass equivalents of all claim elements, even if amended later during prosecution.

What is claimed is:

1. A method of removing a spacer from a post silicide structure, the structure including a gate formed on a surface of the substrate, the spacer formed above the substrate and adjacent the gate, an oxide liner disposed between the spacer and the substrate and the gate, and a silicide layer formed on the substrate, the method comprising:
    depositing an oxide layer over the post silicide structure;
    depositing a nitride layer over said oxide layer;
    removing a portion of said nitride layer, said portion comprising a portion of the nitride layer disposed over a sidewall of the gate, to expose a portion of said oxide layer;
    conducting a short oxide etch to remove less than an entirety of the portion of said oxide layer, such that a raised corner portion of said oxide layer remains after said short oxide etch, said raised corner portion extending above a bottom portion of the oxide liner; and
    subsequently removing the spacer formed on the post silicide structure.

2. The method according to claim 1, wherein said oxide layer is deposited conformally over said post silicide structure.

3. The method according to claim 1, wherein said nitride layer is deposited non-conformally over said oxide layer.

4. The method according to claim 1, wherein said nitride layer is deposited such that a vertical portion of said nitride layer comprises a thickness that is smaller than a thickness of a horizontal portion of said nitride layer.

5. The method according to claim 1, further comprising removing a remaining portion of said nitride layer.

6. The method according to claim 5, further comprising: removing a remaining portion of said oxide layer.

7. The method according to claim 5, further comprising: depositing a stressed nitride layer over said post silicide structure.

8. The method according to claim 1, wherein said spacer is removed without impacting said silicide.

9. The method according to claim 8, further comprising: depositing a stressed nitride layer over said post silicide structure.

10. The method according to claim 1, wherein said oxide layer comprises a thickness in a range of 20 Å to 500 Å.

11. The method according to claim 1, wherein said nitride layer comprises a thickness in a range of 50 Å to 1000 Å.

12. The method according to claim 1, wherein the spacer is completely removed from the post silicide structure.

13. The method according to claim 1, wherein the spacer comprises sidewall spacers formed on each side of a gate structure, and
wherein each of the sidewall spacers is removed from the post silicide structure.

14. The method according to claim 1, wherein said depositing said oxide layer comprises depositing said oxide layer at a temperature of 480° C. or below.

* * * * *